(12) United States Patent
Harigai et al.

(10) Patent No.: US 8,511,799 B2
(45) Date of Patent: Aug. 20, 2013

(54) PIEZOELECTRIC FILM AND METHOD OF MANUFACTURING THE SAME, INK JET HEAD, METHOD OF FORMING IMAGE BY THE INK JET HEAD, ANGULAR VELOCITY SENSOR, METHOD OF MEASURING ANGULAR VELOCITY BY THE ANGULAR VELOCITY SENSOR, PIEZOELECTRIC GENERATING ELEMENT, AND METHOD OF GENERATING ELECTRIC POWER USING THE PIEZOELECTRIC GENERATING ELEMENT

(75) Inventors: Takakiyo Harigai, Kyoto (JP); Yoshiaki Tanaka, Nara (JP); Hideaki Adachi, Osaka (JP); Eiji Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/551,058

(22) Filed: Jul. 17, 2012

(65) Prior Publication Data
US 2012/0281046 A1 Nov. 8, 2012

Related U.S. Application Data

(63) Continuation of application No. PCT/JP2011/003362, filed on Jun. 14, 2011.

(30) Foreign Application Priority Data

Jun. 16, 2010 (JP) .................................. 2010-136962

(51) Int. Cl.
*B41J 2/045* (2006.01)

(52) U.S. Cl.
USPC .......................................................... 347/68

(58) Field of Classification Search
None
See application file for complete search history.

(56) References Cited

U.S. PATENT DOCUMENTS

| | | | |
|---|---|---|---|
| 6,231,779 B1 | 5/2001 | Chiang et al. | |
| 7,235,917 B2 * | 6/2007 | Fukui et al. | 310/364 |

(Continued)

FOREIGN PATENT DOCUMENTS

| | | |
|---|---|---|
| CN | 101981718 A | 2/2011 |
| JP | 04-60073 | 9/1992 |

(Continued)

OTHER PUBLICATIONS

Y. Guo et al., "Structure and electrical properties of trilayered $BaTiO_3/(Na_{0.5}Bi_{0.5})TiO_3,-BaTiO_3/BaTiO_3$, thin films deposited on Si substrate,"Solid State Communications 149 (2009) 14-17.

(Continued)

*Primary Examiner* — Matthew Luu
*Assistant Examiner* — Erica Lin
(74) *Attorney, Agent, or Firm* — McDermott Will & Emery LLP

(57) ABSTRACT

It is an object of the present invention to provide a lead-free piezoelectric film including a lead-free ferroelectric material and having low dielectric loss and high piezoelectric performance comparable to that of PZT, and a method of manufacturing the lead-free piezoelectric film.
The present invention is directed to a piezoelectric film comprising a $(Na_xBi_y)TiO_{0.5x+1.5y+2}$—$BaTiO_3$ layer with a (110) orientation, where $0.30 \leq x \leq 0.46$ and $0.51 \leq y \leq 0.62$.

35 Claims, 8 Drawing Sheets

(56) References Cited

U.S. PATENT DOCUMENTS

| | | | |
|---|---|---|---|
| 7,985,348 B2 * | 7/2011 | Tsukada et al. | 252/62.9 R |
| 2002/0036282 A1 | 3/2002 | Chiang et al. | |
| 2004/0139911 A1 | 7/2004 | Chiang et al. | |
| 2005/0109263 A9 | 5/2005 | Chiang et al. | |
| 2010/0194245 A1 | 8/2010 | Harigai et al. | |
| 2011/0072900 A1 | 3/2011 | Harigai et al. | |

FOREIGN PATENT DOCUMENTS

| | | |
|---|---|---|
| JP | 2001-261435 | 9/2001 |
| JP | 2007-266346 | 10/2007 |
| JP | 2010-241615 A | 10/2010 |
| WO | WO 2010/047049 A1 | 4/2010 |

OTHER PUBLICATIONS

T. Takenaka et al., "$(Bi_{1/2}Na_{1/2})TiO_3$-$BaTiO_3$ System for Lead-Free Piezoelectric Ceramics," Japanese Journal of Applied Physics, vol. 30, No. 9B, Sep. 1991, pp. 2236-2239.

H. Cheng et al., "Combinatorial studies of $(1-x)Na_{0.5}Bi_{0.5}TiO_3$-$xBaTiO_3$ thin-film chips," Applied Physics Letters, vol. 85, No. 12, Sep. 2004.

Z.H. Zhou et al., "Ferroelectric and electrical behavior of $(Na_{0.5}Bi_{0.5})TiO_3$ thin films," Applied Physics Letters, vol. 85, No. 5, Aug. 2004.

International Search Report issued in International Patent Application No. PCT/JP2011/003362 dated Sep. 6, 2011.

* cited by examiner

US 8,511,799 B2

PIEZOELECTRIC FILM AND METHOD OF MANUFACTURING THE SAME, INK JET HEAD, METHOD OF FORMING IMAGE BY THE INK JET HEAD, ANGULAR VELOCITY SENSOR, METHOD OF MEASURING ANGULAR VELOCITY BY THE ANGULAR VELOCITY SENSOR, PIEZOELECTRIC GENERATING ELEMENT, AND METHOD OF GENERATING ELECTRIC POWER USING THE PIEZOELECTRIC GENERATING ELEMENT

This is a continuation of International Application No. PCT/JP2011/003362, with an international filing date of Jun. 14, 2011, which claims priority of Japanese Patent Application No. 2010-136962, filed on Jun. 16, 2010, the contents of which are hereby incorporated by reference.

TECHNICAL FIELD

The present invention relates to a piezoelectric film including a piezoelectric layer and a method of manufacturing the same. The present invention further relates to an ink jet head including the piezoelectric film and a method of forming an image by the head, to an angular velocity sensor including the piezoelectric film and a method of measuring an angular velocity by the sensor, and to a piezoelectric generating element including the piezoelectric film and a method of generating electric power using the element.

BACKGROUND ART

Lead zirconate titanate (PZT: $Pb(Zr_xTi_{1-x})O_3$, $0<x<1$) is a typical ferroelectric material capable of storing a large amount of electric charge, and used in capacitors and film memories. PZT has pyroelectricity and piezoelectricity based on the ferroelectricity thereof. PZT has high piezoelectric performance, and its mechanical quality factor Qm can be controlled easily by adjusting the composition or adding an element thereto. This allows PZT to be applied to sensors, actuators, ultrasonic motors, filter circuits, and oscillators.

PZT, however, contains a large amount of lead. In recent years, there has been a growing concern that lead leached from waste may cause serious damage to the ecosystem and the environment. Accordingly, there has been an international movement toward restricting the use of lead. For this reason, non-lead-containing (that is, lead-free) ferroelectric materials, unlike PZT, have been in demand.

One of the lead-free ferroelectric materials that are currently under development is, for example, a perovskite-type composite oxide $[(Bi_{0.5}Na_{0.5})_{1-y}Ba_y]TiO_3$ made of bismuth (Bi), sodium (Na), barium (Ba), and titanium (Ti). Patent Literature 1 and Non Patent Literature 1 disclose that this ferroelectric material exhibits high piezoelectric performance of about 125 pC/N in terms of a piezoelectric constant d33, when the $[(Bi_{0.5}Na_{0.5})_{1-y}Ba_y]TiO_3$ has composition around the Morphotropic Phase Boundary with the content of barium y (=[Ba/(Bi+Na+Ba)]) is 5 to 10%. The piezoelectric performance of the ferroelectric material is, however, lower than that of PZT.

Patent Literature 2, Non Patent Literature 2, and Non Patent Literature 3 disclose that a (Bi,Na,Ba)TiO3 layer that is oriented in a specific direction is fabricated.

The non-obviousness from Patent Literature 3 in view of Patent Literature 4 is described later.

CITATION LIST

Patent Literature

[Patent Literature 1]
Japanese Patent Publication No. H04-060073B
[Patent Literature 2]
Japanese Patent Application Publication No. 2007-266346
[Patent Literature 3]
Japanese Patent Application Publication No. 2001-261435
[Patent Literature 4]
U.S. Patent Application Publication No. 2005/0109263 (particularly, BNT-08 7 of Table 1 in page 15)
[Patent Literature 5]
International publication No. 2010/047049
[Patent Literature 6]
U.S. Pat. No. 7,870,787
[Patent Literature 7]
Chinese Patent Application Publication No. 101981718

Non Patent Literature

[Non Patent Literature 1]
T. Takenaka et al., Japanese Journal of Applied Physics, Vol. 30, No. 9B, (1991), pp. 2236-2239
[Non Patent Literature 2]
H. W. Cheng et al., Applied Physics Letters, Vol. 85, (2004), pp. 231 9-2321
[Non Patent Literature 3]
Z. H. Zhou et al., Applied Physics Letters, Vol. 85, (2004), pp. 804-806

SUMMARY OF INVENTION

One non-limiting and exemplary embodiment provides a lead-free piezoelectric film including a lead-free ferroelectric material and having low dielectric loss and high piezoelectric performance comparable to that of PZT, and a method of manufacturing the piezoelectric film.

It is another object of the present invention to provide an ink jet head, an angular velocity sensor, and a piezoelectric generating element, each including the lead-free piezoelectric film. It is still another object of the present invention to provide a method of forming an image by this ink jet head, a method of measuring an angular velocity by this angular velocity sensor, and a method of generating electric power using this piezoelectric generating element.

A piezoelectric film of the present invention comprises a $(Na_xBi_y)TiO_{0.5x+1.5y+2}$—$BaTiO_3$ layer with a (110) orientation, where $0.30 \leq x \leq 0.46$ and $0.51 \leq y \leq 0.62$.

DESCRIPTION OF EMBODIMENTS

Figure 1A:
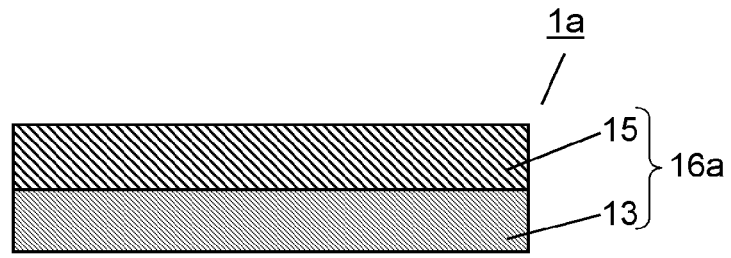
FIG. 1A is a cross-sectional view schematically showing an example of a piezoelectric film of the present invention.

Hereinafter, embodiments of the present invention will be described. In the following description, the same reference numerals are used to designate the same elements and parts, and therefore the overlapping description thereof can be omitted.

[Piezoelectric Film]

FIG. 1A shows one embodiment of a piezoelectric film according to the present invention. A piezoelectric film $1a$ shown in FIG. 1A has a multilayer structure $16a$. The multilayer structure $16a$ has an electrode layer 13 with a (110) orientation and a $(Na_xBi_y)TiO_{0.5x+1.5y+2}$—$BaTiO_3$ layer 15 ($0.30 \leq x \leq 0.46$ and $0.51 \leq y \leq 0.62$) with a (110) orientation in this order. These layers 13 and 15 are laminated in contact with each other. The $(Na_xBi_y)TiO_{0.5x+1.5y+2}$—$BaTiO_3$ layer 15 is a piezoelectric layer. The $(Na_xBi_y)TiO_{0.5x+1.5y+2}$—$BaTiO_3$ layer 15 has small leak current, high crystallinity, and high (110) orientation. This allows the piezoelectric film $1a$ to have low dielectric loss and high piezoelectric performance comparable to that of PZT, although it contains no lead.

Examples of the electrode layer 13 with a (110) orientation are described below.

(1) a metal layer such as platinum (Pt), palladium (Pd), or gold (Au), and (2) a conductive oxide layer such as nickel oxide (NiO), ruthenium oxide ($RuO_2$), iridium oxide ($IrO_2$), strontium ruthenate ($SrRuO_3$), or lanthanum-nickelate ($LaNiO_3$).

Two or more these layers may be also used.

Typically, the Pt electrode layer 13 can be formed by sputtering. The Pt electrode layer 13 can be formed by film formation techniques such as pulsed laser deposition (PLD), chemical vapor deposition (CVD), sol-gel processing, and aerosol deposition (AD).

In the piezoelectric film manufacturing method of the present invention, sputtering is used to form the Pt electrode layer 13 having a (110) orientation.

The $(Na_xBi_y)TiO_{0.5x+1.5y+2}$—$BaTiO_3$ layer 15 is formed on the Pt electrode layer 13 by sputtering.

The layer 15 with a (110) orientation is made of $(Na_xBi_y)TiO_{0.5x+1.5y+2}$—$BaTiO_3$ ($0.30 \leq x \leq 0.46$ and $0.51 \leq y \leq 0.62$).

The $(Na_xBi_y)TiO_{0.5x+1.5y+2}$—$BaTiO_3$ layer 15 has a plane orientation of (110) on its surface.

The value of "0.5x+1.5y+2" which represents the oxygen amount in sodium•bismuth titanate may include error. For example, when x=0.41 and y=0.53, the value of "0.5×0.41+1.5×0.53+2" is equal to 3. However, even when the amount of sodium is 0.41 and the amount of bismuth is 0.53, the oxygen amount in sodium•bismuth titanate does not always correspond with the value of "3".

The thickness of the $(Na_xBi_y)TiO_{0.5x+1.5y+2}$—$BaTiO_3$ layer 15 is not limited. The thickness thereof is at least 0.5 μm but not more than 10 μm, for example. Even when the $(Na_xBi_y)TiO_{0.5x+1.5y+2}$—$BaTiO_3$ layer 15 is thin, the $(Na_xBi_y)TiO_{0.5x+1.5y+2}$—$BaTiO_3$ layer 15 has low dielectric loss and high piezoelectric performance.

It is difficult to estimate the composition suitable for forming a piezoelectric layer having high crystallinity, high orientation, low dielectric loss, and high performance equivalent to that of PZT based on the similarity of the lattice constants or the composition of the piezoelectric layer. This is because it is generally difficult to form a thin film composed of a multi-component composite oxide having high crystallinity and high orientation, like $(Bi,Na,Ba)TiO_3$, due to a difference in the vapor pressure of each constituent element (except for oxygen) of the oxide. The present inventors have discovered that the $(Na_xBi_y)TiO_{0.5x+1.5y+2}$—$BaTiO_3$ layer 15 has high crystallinity and high (110) orientation without use of a buffer layer.

The $(Na_xBi_y)TiO_{0.5x+1.5y+2}$—$BaTiO_3$ layer 15 has a perovskite-type crystal structure represented by the chemical formula $ABO_3$. The A site and B site in the perovskite structure have average valences of 2 and 4, respectively, depending on the placement of a single element or a plurality of elements. The A site is Bi, Na, and Ba. The B site is Ti. The $(Na_xBi_y)TiO_{0.5x+1.5y+2}$—$BaTiO_3$ layer 15 may contain a trace amount of impurities. The impurities typically may be Li and K to substitute for Na, and Sr and Ca to substitute for Ba, in the A site. The impurity typically may be Zr to substitute for Ti in the B site. Examples of the other impurities may include Mn, Fe, Nb, and Ta. Some of these impurities can improve the crystallinity and piezoelectric performance of the $(Na_xBi_y)TiO_{0.5x+1.5y+2}$—$BaTiO_3$ layer 15.

A (110)-oriented layer further may be optionally sandwiched between the Pt electrode layer 13 and the $(Na_xBi_y)TiO_{0.5x+1.5y+2}$—$BaTiO_3$ layer 15. The (110)-oriented layer is, for example, a $LaNiO_3$ layer or a $SrRuO_3$ layer.

Typically, $(Na_xBi_y)TiO_{0.5x+1.5y+2}$—$BaTiO_3$ layer 15 can be formed by a sputtering method. The $(Na_xBi_y)TiO_{0.5x+1.5y+2}$—$BaTiO_3$ layer 15 can be formed by other film formation techniques such as PLD, CVD, sol-gel processing, and AD as long as it has a (110) orientation.

Figure 1B:
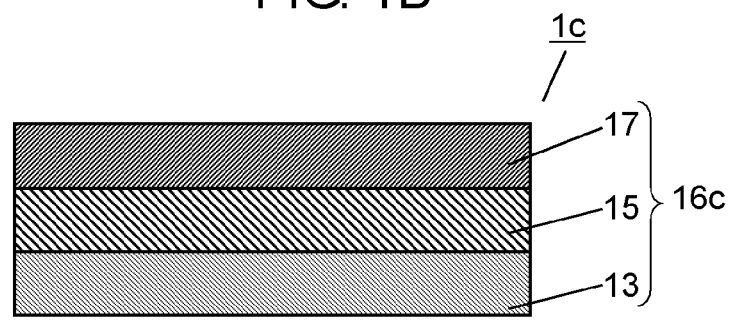
FIG. 1B is a cross-sectional view schematically showing another example of the piezoelectric film of the present invention.

FIG. 1B shows another embodiment of the piezoelectric film according to the present invention. A piezoelectric film $1c$ shown in FIG. 1B has a multilayer structure $16c$. The multilayer structure $16c$ is a structure in which the multilayer structure $16a$ shown in FIG. 1A further includes a conductive layer 17. The conductive layer 17 is formed on the $(Na_xBi_y)TiO_{0.5x+1.5y+2}$—$BaTiO_3$ layer 15. Particularly, the multilayer structure $16c$ has the Pt electrode layer 13 having a (110) orientation, the $(Na_xBi_y)TiO_{0.5x+1.5y+2}$—$BaTiO_3$ layer 15 having a (110) orientation, and the conductive layer 17 in this order. These layers are laminated in contact with each other.

In the piezoelectric film $1c$, the $(Na_xBi_y)TiO_{0.5x+1.5y+2}$—$BaTiO_3$ layer 15 is interposed between the Pt electrode layer 13 and the conductive layer 17. The Pt electrode layer 13 and the conductive layer 17 can serve as an electrode layer for applying a voltage to the $(\text{Na}_x\text{Bi}_y)\text{TiO}_{0.5x+1.5y+2}$—$\text{BaTiO}_3$ layer 15, which is a piezoelectric layer.

The conductive layer 17 is composed of a conductive material. An example of the material is a metal having low electrical resistance. The material may be a conductive oxide such as NiO, $\text{RuO}_2$, $\text{IrO}_3$, $\text{SrRuO}_3$, or $\text{LaNiO}_3$. The conductive layer 17 may be composed of two or more these materials. An adhesive layer improving an adhesion between the conductive layer 17 and the $(\text{Na}_x\text{Bi}_y)\text{TiO}_{0.5x+1.5y+2}$—$\text{BaTiO}_3$ layer 15 may be provided therebetween. An example of the material of the adhesive layer is titanium (Ti). The material may be tantalum (Ta), iron (Fe), cobalt (Co), nickel (Ni), chrome (Cr), or a compound thereof. The adhesive layer may be composed of two or more these materials. The adhesive layer may be omitted depending on the adhesion between the conductive layer 17 and the $(\text{Na}_x\text{Bi}_y)\text{TiO}_{0.5x+1.5y+2}$—$\text{BaTiO}_3$ layer 15.

The piezoelectric film 1c shown in FIG. 1B can be manufactured by forming, the $(\text{Na}_x\text{Bi}_y)\text{TiO}_{0.5x+1.5y+2}$—$\text{BaTiO}_3$ layer 15 and the conductive layer 17 on the Pt electrode layer 13 in this order. The conductive layer 17 can be formed by film formation techniques such as sputtering, PLD, CVD, sol-gel processing, or AD.

The present method of fabricating a piezoelectric film can further comprise a step of forming the conductive layer 17 on the $(\text{Na}_x\text{Bi}_y)\text{TiO}_{0.5x+1.5y+2}$—$\text{BaTiO}_3$ layer 15. Thus, the piezoelectric film 1c shown in FIG. 1B can be fabricated.

Figure 1C:
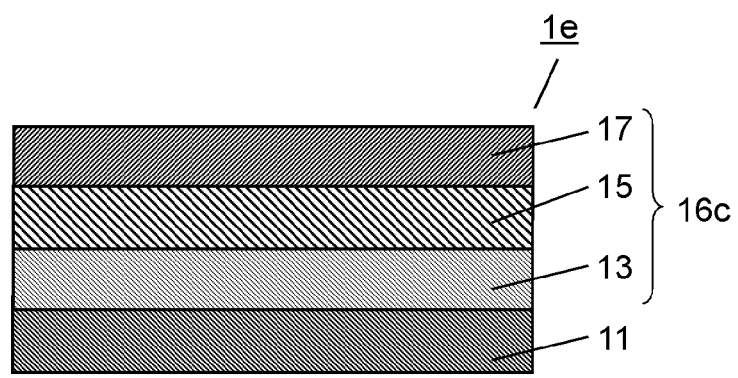
FIG. 1C is a cross-sectional view schematically showing still another example of the piezoelectric film of the present invention.

The piezoelectric film according to the present invention may further comprise a substrate 11 as shown in FIG. 1C. The Pt electrode layer 13 is formed on the substrate.

In the piezoelectric film 1e shown in FIG. 1C, the multilayer structure 16c shown in FIG. 1B is formed on the substrate 11.

The substrate 11 may be a silicon (Si) substrate or a MgO substrate. A Si substrate is preferred.

An adhesive layer improving an adhesion between the substrate 11 and the multilayer structure 16c (more particularly, between the substrate 11 and the Pt electrode layer 13) may be provided therebetween. However, the adhesive layer is required to be conductive. An example of the material of the adhesive layer is titanium (Ti). The material may be tantalum (Ta), iron (Fe), cobalt (Co), nickel (Ni), chrome (Cr), or a compound thereof. The adhesive layer may be composed of two or more these materials. The adhesive layer may be omitted depending on the adhesion between the substrate 11 and the multilayer structure 16c.

The piezoelectric film 1e shown in FIG. 1C can be fabricated by forming the Pt electrode layer 13, the $(\text{Na}_x\text{Bi}_y)\text{TiO}_{0.5x+1.5y+2}$—$\text{BaTiO}_3$ layer 15, and the conductive layer 17 on the substrate 11 in this order.

The present method of fabricating the piezoelectric film may comprise a step of forming the Pt electrode layer 13 on the substrate 11.

The piezoelectric films 1a and 1c shown in FIG. 1A and FIG. 1B may be fabricated with use of a base substrate. Particularly, one of the multilayer structures 16a and 16c may be formed on the base substrate to remove the base substrate. Thus, the piezoelectric films 1a and 1c may be fabricated. The base substrate may be removed by a known method such as etching.

The piezoelectric film 1e shown in FIG. 1C may be also fabricated with use of a base substrate. In one specific embodiment, the base substrate doubles as the substrate 11. After the multilayer structure 16c may be formed on the base substrate, the base substrate is removed. Subsequently, the multilayer structure 16c may be disposed on the substrate 11 which is prepared separately. Thus, the piezoelectric film 1e may be fabricated.

The base substrate can be one of the following substrates: a substrate made of an oxide having a NaCl structure, such as MgO; a substrate made of an oxide having a perovskite structure, such as $\text{SrTiO}_3$, $\text{LaAlO}_3$, and $\text{NdGaO}_3$; a substrate made of an oxide having a corundum structure, such as $\text{Al}_2\text{O}_3$; a substrate made of an oxide having a spinel structure, such as $\text{MgAl}_2\text{O}_4$; a substrate made of an oxide having a rutile structure, such as $\text{TiO}_2$; and a substrate made of an oxide having a cubic crystal structure, such as $(\text{La},\text{Sr})(\text{Al},\text{Ta})\text{O}_3$, and yttria-stabilized zirconia (YSZ). The base substrate can be formed by laminating an oxide layer having a NaCl type crystal structure on the surface of a glass substrate, a ceramic substrate such as an alumina substrate, or a metal substrate such as a stainless steel substrate. In this case, the Pt electrode layer 13 can be formed on the surface of the oxide layer. Examples of the oxide layer include a MgO layer, a NiO layer, and a cobalt oxide (CoO) layer.

As described above, the present method of fabricating the piezoelectric film may comprise a step of forming the Pt electrode layer 13 on the base substrate directly or via another layer. After the base substrate which can double as the substrate 11 is removed, a different substrate may be disposed. In this case, the different substrate may be disposed so that the different substrate is in contact with the Pt electrode layer 13. The different substrate may be disposed so that the different substrate is in contact with the $(\text{Na}_x\text{Bi}_y)\text{TiO}_{0.5x+1.5y+2}$—$\text{BaTiO}_3$ layer 15. In the latter case, a piezoelectric film where the $(\text{Na}_x\text{Bi}_y)\text{TiO}_{0.5x+1.5y+2}$—$\text{BaTiO}_3$ layer 15, and the Pt electrode layer 13 are formed on the different substrate in this order is obtained.

In the following, an inkjet head, an angular velocity sensor and a piezoelectric generating element of the present invention using the above mentioned piezoelectric film are explained. Please refer the Patent Literature 5 about the detail. The Patent Literature 6 and 7 are each US patent publication and Chinese patent application publication corresponding to Patent Literature 5.

[Ink Jet Head]

An ink jet head of the present invention will be described below with reference to FIG. 2 to FIG. 4.

Figure 2:
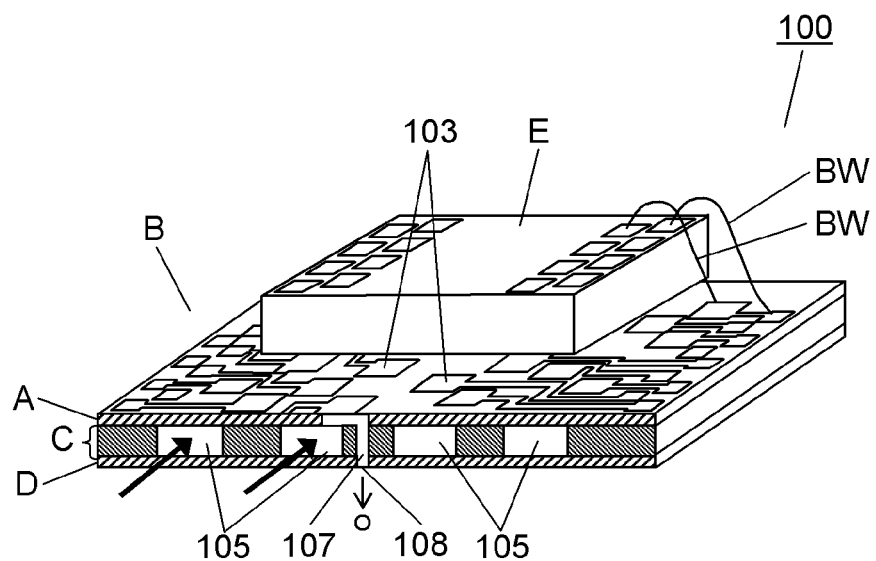
FIG. 2 is a perspective view schematically showing an example of an ink jet head of the present invention and partially showing a cross section of the ink jet head.

FIG. 2 shows one embodiment of the ink jet head of the present invention. FIG. 3 is an exploded view showing main parts including a pressure chamber member and an actuator part in an ink jet head 100 shown in FIG. 2.

Figure 3:
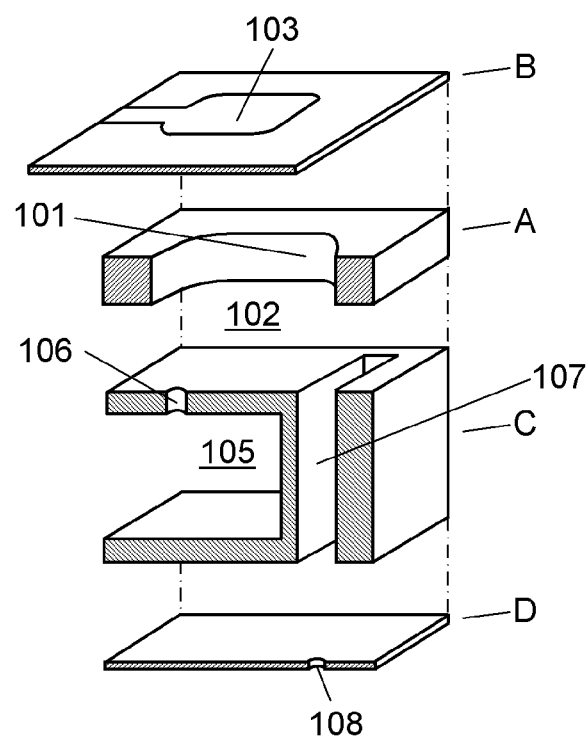
FIG. 3 is an exploded perspective view schematically showing main parts including a pressure chamber member and an actuator part in the ink jet head shown in FIG. 2 and partially showing a cross section of the main parts.

A reference character A in FIG. 2 and FIG. 3 indicates a pressure chamber member. The pressure chamber member A includes through-holes 101 that penetrate therethrough in its thickness direction (in the upward and downward directions in these diagrams). The through-hole 101 shown in FIG. 3 is a part of the through-hole 101 in the cross section in the thickness direction of the pressure chamber member A. A reference character B indicates an actuator part including piezoelectric films and vibration layers. A reference character C indicates an ink passage member C including common liquid chambers 105 and ink passages 107. The pressure chamber member A, the actuator part B, and the ink passage member C are bonded to each other so that the pressure chamber member A is sandwiched between the actuator part B and the ink passage member C. When the pressure chamber member A, the actuator part B, and the ink passage member C are bonded to each other, each of the through-holes 101 forms a pressure chamber 102 for storing ink supplied from the common liquid chamber 105.

The actuator part B has piezoelectric films and vibration layers that are aligned over the corresponding pressure chambers 102 respectively in plan view. In FIG. 2 and FIG. 3, a reference numeral 103 indicates an individual electrode layer that is a part of the piezoelectric film. As shown in FIG. 2, in the ink jet head 100, a plurality of individual electrode layers 103, that is, piezoelectric films are arranged in a zigzag pattern in plan view.

The ink passage member C has a plurality of common liquid chambers 105 arranged in stripes in plan view. In FIG. 2 and FIG. 3, each of the common liquid chambers 105 is aligned over a plurality of pressure chambers 102 in plan view. The common liquid chambers 105 extend in the ink supply direction (in the direction indicated by arrows in FIG. 2) in the ink jet head 100. The ink passage member C has supply ports 106, each of which supplies the ink in the common liquid chamber 105 to one of the pressure chambers 102, and ink passages 107, each of which ejects the ink in the corresponding pressure chamber 102 through the corresponding nozzle hole 108. Usually, one pressure chamber 102 has one supply port 106 and one nozzle hole 108. The nozzle holes 108 are formed in a nozzle plate D. The nozzle plate D is bonded to the ink passage member C so that the nozzle plate D and the pressure chamber member A sandwich the ink passage member C therebetween.

In FIG. 2, a reference character E indicates an IC chip. The IC chip E is connected electrically to the individual electrode layers 103, which are exposed on the surface of the actuator part B, through bonding wires BW. For simplicity of FIG. 2, only a part of the bonding wires BW are shown in FIG. 2.

FIG. 3 shows the configuration of the main parts including the pressure chamber member A and the actuator part B. FIG. 4 shows the cross section perpendicular to the ink supply direction (in the direction indicated by the arrows in FIG. 2) in the pressure chamber member A and the actuator part B. The actuator part B includes piezoelectric films 104 (104a to 104d) each having the piezoelectric layer 15 sandwiched between the first electrode (the individual electrode layer 103) and the second electrode (the common electrode layer 112). The individual electrode layers 103 correspond one to one to the piezoelectric films 104a to 104d. The common electrode layer 112 is a single layer electrode that is common to the piezoelectric films 104a to 104d.

Figure 4:
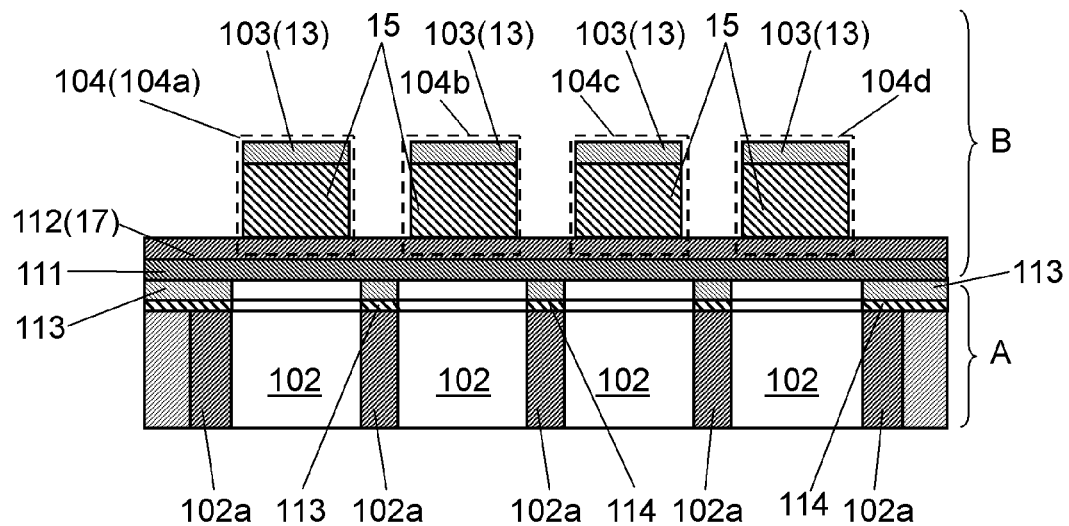
FIG. 4 is a cross-sectional view schematically showing an example of the main parts including the pressure chamber member and the actuator part in the ink jet head shown in FIG. 2.

As surrounded by the dashed-line in FIG. 4, the above-mentioned piezoelectric films 104 are arranged in the ink jet head. The piezoelectric film is the piezoelectric film described in the item titled as "Piezoelectric film".

Though not indicated in FIG. 4, as described in FIGS. 1B, 1D, 1E, the metal electrode layer 12 can be included.

[Image Forming Method by Ink Jet Head]

The image forming method of the present invention includes, in the above-described ink jet head of the present invention, a step of applying a voltage to the piezoelectric layer through the first and second electrodes (that is, the individual electrode layer and the common electrode layer) to displace, based on the piezoelectric effect, the vibration layer in its film thickness direction so that the volumetric capacity of the pressure chamber changes; and a step of ejecting the ink from the pressure chamber by the displacement.

The voltage to be applied to the piezoelectric layer is changed with the relative position between the ink jet head and an object like a sheet of paper, on which an image is to be formed, being changed, so as to control the timing of ink ejection from the ink jet head and the amount of ink ejected therefrom. As a result, an image is formed on the surface of the object. The term "image" used in the present description includes a character. In other words, according to the present method for forming an image, a letter, a picture, or a figure is printed to a print target such as a sheet of paper. With this method, a picturesque image can be printed.

[Angular Velocity Sensor]

Figure 5:
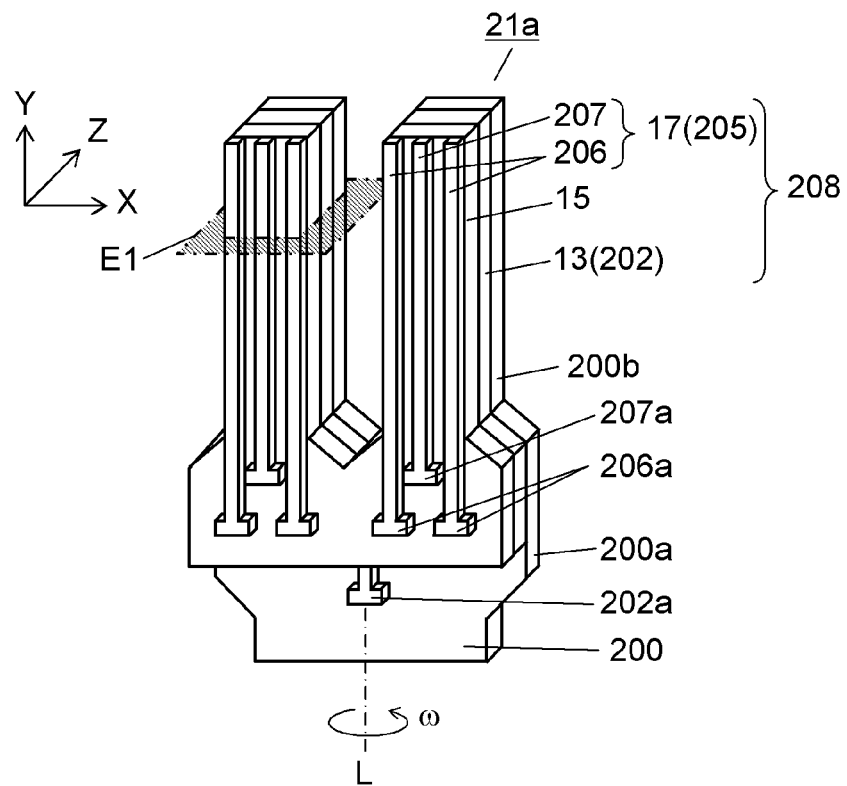
FIG. 5 is a perspective view schematically showing an example of an angular velocity sensor of the present invention.
Figure 6:
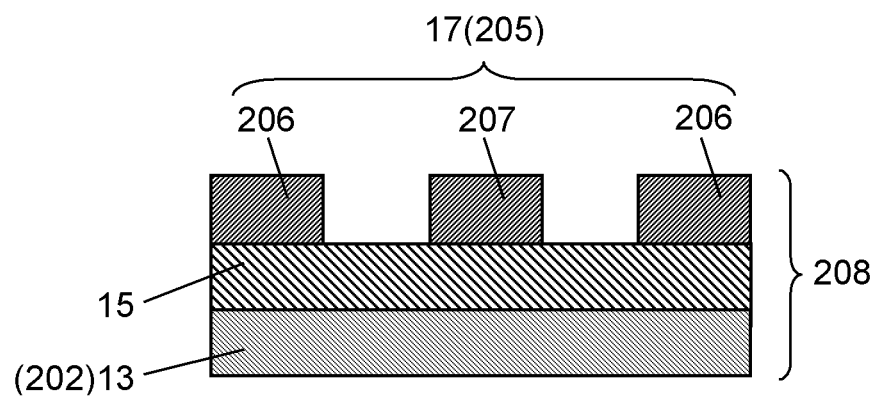
FIG. 6 is a cross-sectional view showing a cross section E1 of the angular velocity sensor shown in FIG. 5.

FIG. 5 shows examples of an angular velocity sensor of the present invention. FIG. 6 shows a cross section E1 of an angular velocity sensor 21a shown in FIG. 5. The angular velocity sensor 21a shown in FIG. 5 is a so-called tuning-fork type angular velocity sensor. This type of angular velocity sensor can be used in a navigation apparatus for a vehicle, and as a sensor for correcting image blurring due to hand movement in a digital still camera.

The angular velocity sensor 21a shown in FIG. 5 includes a substrate 200 having vibration parts 200b and piezoelectric films 208 bonded to the vibration parts 200b.

The substrate 200 has a stationary part 200a and a pair of arms (vibration parts 200b) extending in a predetermined direction from the stationary part 200a. The direction in which the vibration parts 200b extend is the same as the direction in which the central axis of rotation L of the angular velocity detected by the angular velocity sensor 21 extends. Particularly, it is the Y direction in FIG. 5. The substrate 200 has a shape of a tuning fork including two arms (vibration parts 200b), when viewed from the thickness direction of the substrate 200 (the Z direction in FIG. 5).

The material of the substrate 200 is not limited. The material is, for example, Si, glass, ceramic, or metal. A monocrystalline Si substrate can be used as the substrate 200. The thickness of the substrate 200 is not limited as long as the functions of the angular velocity sensor 21a can develop. More particularly, the substrate 200 has a thickness of at least 0.1 mm but not more than 0.8 mm. The thickness of the stationary part 200a can be different from that of the vibration part 200b.

The piezoelectric film 208 is bonded to the vibration part 200b. The piezoelectric film 208 is the piezoelectric film described in the item titled as "Piezoelectric film". As shown in FIG. 5 and FIG. 6, the piezoelectric film 208 comprises the first electrode 13 (202), the piezoelectric layer 15, and the second electrode 17 (205).

The second electrode 205 has an electrode group including a drive electrode 206 and a sense electrode 207. The drive electrode 206 applies a driving voltage that oscillates the vibration part 200b to the piezoelectric layer 15. The sense electrode 207 measures a deformation of the vibration part 200b caused by an angular velocity applied to the vibration part 200b. That is, the vibration part 200b usually oscillates in the width direction thereof (the X direction in FIG. 5). More particularly, in the angular velocity sensor shown in FIG. 5, a pair of drive electrodes 206 are provided on both of the width-direction edge portions of the vibration part 200b along the length direction thereof (the Y direction in FIG. 5). Only one drive electrode 206 may be provided on one of the width-direction edge portions of the vibration part 200b. In the angular velocity sensor shown in FIG. 5, the sense electrode 207 is provided along the length direction of the vibration part 200b and sandwiched between the pair of drive electrodes 206. A plurality of sense electrodes 207 may be provided on the vibration part 200b. The deformation of the vibration part 200b measured by the sense electrode 207 usually is a deflection in the thickness direction thereof (the Z direction in FIG. 5).

In the angular velocity sensor of the present invention, one of the first electrode and the second electrode selected therefrom can be composed of an electrode group including the drive electrode and the sense electrode. In the angular velocity sensor 21a shown in FIG. 5, the second electrode 205 is composed of the electrode group. Unlike this angular velocity sensor, the first electrode 202 can be composed of the electrode group.

The first electrode 202, the drive electrode 206, and the sense electrode 207 have connection terminals 202a, 206a, and 207a, respectively, formed at the end portions thereof. The shape and position of each of the connection terminals are not limited. In FIG. 5, the connection terminals are provided on the stationary part 200a.

In the angular velocity sensor shown in FIG. 5, the piezoelectric film 208 is bonded to both the vibration part 200b and the stationary part 200a. The bonding state of the piezoelectric film 208 is not limited as long as the piezoelectric film 208 can oscillate the vibration part 200b and measure the deformation of the vibration part 200b. For example, the piezoelectric film 208 may be bonded only to the vibration part 200b.

The angular velocity sensor of the present invention may have two or more vibration part groups each consisting of a pair of vibration parts 200b. Such an angular velocity sensor can serve as a biaxial or triaxial angular velocity sensor capable of measuring angular velocities with respect to a plurality central axes of rotation. The angular velocity sensor shown in FIG. 5 has one vibration part group consisting of a pair of vibration parts 200b.

[Method of Measuring Angular Velocity by Angular Velocity Sensor]

The angular velocity measuring method of the present invention uses the angular velocity sensor of the present invention, and includes the steps of; applying a driving voltage to the piezoelectric layer to oscillate the vibration part of the substrate; and measuring a deformation of the vibration part caused by an angular velocity applied to the oscillating vibration part to obtain a value of the applied angular velocity. The driving voltage is applied between the drive electrode and one of the first electrode and the second electrode (the other electrode) that serves neither as the drive electrode nor as the sense electrode, and thus the driving voltage is applied to the piezoelectric layer. The sense electrode and the other electrode measure the deformation of the oscillating vibration part caused by the angular velocity.

Hereinafter, the angular velocity measuring method by the angular velocity sensor 21a shown in FIG. 5 is described. A driving voltage having a frequency that resonates with the natural vibration of the vibration part 200b is applied to the piezoelectric layer 15 through the first electrode 202 and the drive electrode 206 so as to oscillate the vibration part 200b. The driving voltage can be applied, for example, by grounding the first electrode 202 and changing the potential of the driving electrode 206 (in other words, the driving voltage is the potential difference between the first electrode 202 and the driving electrode 206). The angular velocity sensor 21a includes a pair of vibration parts 200b that are arranged in the form of the tuning fork. Usually, reverse (positive and negative) voltages are applied to the drive electrodes 206 provided on the respective vibration parts 200b of the pair. This allows the respective vibration parts 200b to oscillate in the mode in which they vibrate in the directions opposite to each other (the mode in which they vibrate symmetrically with respect to the central axis of rotation L shown in FIG. 5). In the angular velocity sensors 21a shown in FIG. 5, the vibration parts 200b oscillate in their width direction (the X direction). The angular velocity can be measured by oscillating only one of the pair of vibration parts 200b. For accurate measurement, however, it is preferable to oscillate both of the vibration parts 200b in the mode in which they vibrate in the directions opposite to each other.

When an angular velocity ω with respect to the central axis of rotation L is applied to the angular velocity sensor 21a in which the vibration parts 200b are oscillating, the vibration parts 200b are deflected respectively in their thickness direction (the Z direction) by Coriolis force. In the case where the respective vibration parts 200b are oscillating in the mode in which they vibrate in the directions opposite to each other, they are deflected in the opposite directions by the same degree. The piezoelectric layer 15 bonded to the vibration part 200b is also deflected according to this deflection of the vibration part 200b. As a result, a potential difference is generated between the first electrode 202 and the sense electrode 207 in accordance with the deflection of the piezoelectric layer 15, that is, the magnitude of the generated Coriolis force. The angular velocity ω applied to the angular velocity sensor 21a can be measured by measuring the magnitude of the potential difference.

The following relationship between a Coriolis force Fc and an angular velocity ω is true:

$$Fc = 2mv\omega$$

where v is the velocity of the oscillating vibration part 200b in the oscillation direction, and m is the mass of the vibration part 200b. As shown in this equation, the angular velocity ω can be calculated from the Coriolis force Fc.

[Piezoelectric Generating Element]

Figure 7:
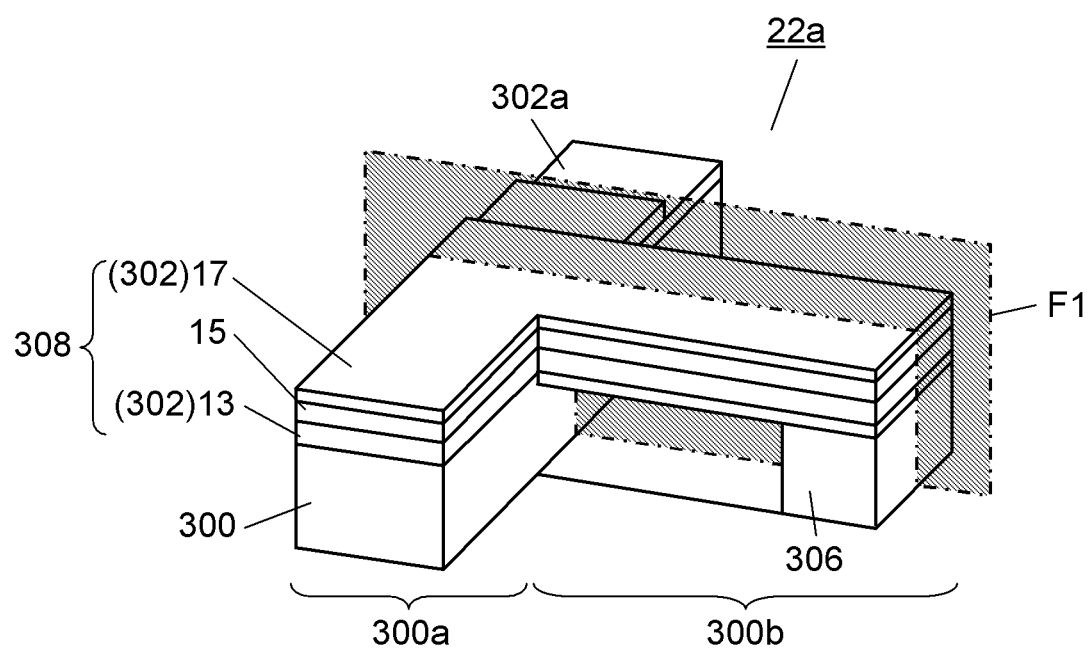
FIG. 7 is a perspective view schematically showing an example of a piezoelectric generating element of the present invention.
Figure 8:
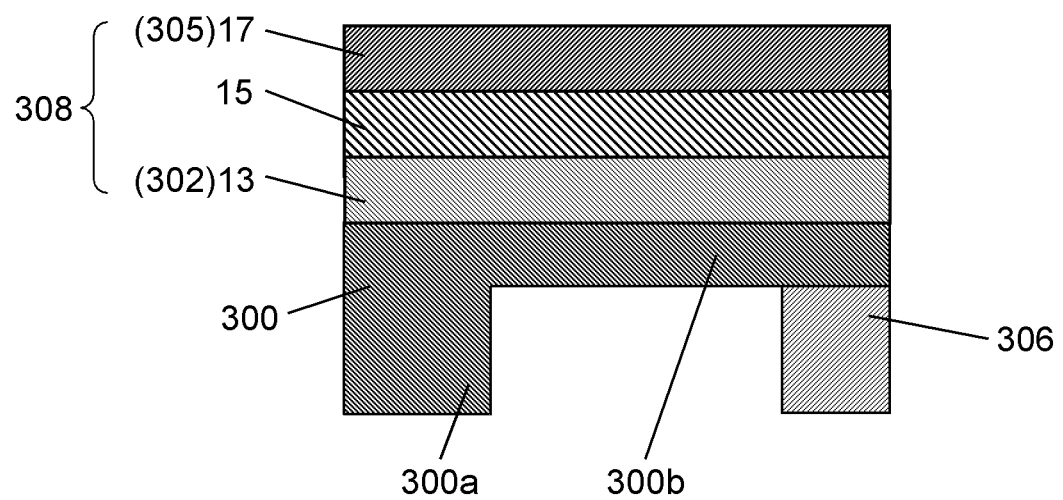
FIG. 8 is a cross-sectional view showing a cross section F1 of the piezoelectric generating element shown in FIG. 7.

FIG. 7 shows an example of the piezoelectric generating element of the present invention. FIG. 8 shows a cross section F1 of a piezoelectric generating element 22a shown in FIG. 7. The piezoelectric generating elements 22a are elements that convert externally-applied mechanical vibration into electrical energy. The piezoelectric generating elements 22a are applied suitably to a self-sustained power supply for generating electric power from various vibrations including engine vibrations and driving vibrations generated in vehicles and machines, and vibrations generated during walking.

The piezoelectric generating element 22a shown in FIG. 7 includes a substrate 300 having a vibration part 300b and a piezoelectric film 308 bonded to the vibration part 300b.

The substrate 300 has a stationary part 300a, and a vibration part 300b having a beam extending in a predetermined direction from the stationary part 300a. The material of the stationary part 300a can be the same as the material of the vibration part 300b. These materials may, however, be different from each other. The stationary part 300a and the vibration part 300b made of materials different from each other may be bonded to each other.

The material of the substrate 300 is not limited. The material is, for example, Si, glass, ceramic, or metal. A monocrystalline Si substrate can be used as the substrate 300. The substrate 300 has a thickness of, for example, at least 0.1 mm but not more than 0.8 mm. The stationary part 300a may have a thickness different from that of the vibration part 300b. The thickness of the vibration part 300b can be adjusted for efficient power generation by changing the resonance frequency of the vibration part 300b.

A weight load 306 is bonded to the vibration part 300b. The weight load 306 adjusts the resonance frequency of the vibration part 300b. The weight load 306 is, for example, a vapor-deposited thin film of Ni. The material, shape, and mass of the weight load 306, as well as the position to which the weight load 306 is bonded can be adjusted according to a desired resonance frequency of the vibration part 300b. The weight load 306 may be omitted. The weight load 306 is not necessary when the resonance frequency of the vibration part 300b is not adjusted.

The piezoelectric film 308 is bonded to the vibration part 300b. The piezoelectric film 308 is the piezoelectric film described in the item titled as "Piezoelectric film". As shown in FIG. 7 and FIG. 8, the piezoelectric film 308 comprises the first electrode 13 (302), the piezoelectric layer 15, the second electrode 17 (305).

In the piezoelectric generating elements shown in FIG. 7, a part of the first electrode 302 is exposed. This part can serve as a connection terminal 302a.

In the piezoelectric generating element shown in FIG. 7, the piezoelectric film 308 can be bonded to both of the vibration part 300b and the stationary part 300a. The piezoelectric film 308 can be bonded only to the vibration part 300b.

When the piezoelectric generating element of the present invention has a plurality of vibration parts 300b, an increased amount of electric power can be generated. Such a piezoelectric generating element can be applied to mechanical vibrations containing a wide range of frequency components if the plurality of vibration parts 300b have different resonance frequencies.

[Method of Generating Electric Power Using Piezoelectric Generating Element]

The above-described piezoelectric generating element of the present invention is vibrated to obtain electric power through the first electrode and the second electrode.

When mechanical vibration is applied externally to the piezoelectric generating element 22a, the vibration part 300b starts vibrating to produce vertical deflection with respect to the stationary part 300a. The piezoelectric effect produced by this vibration generates an electromotive force across the piezoelectric layer 15. As a result, a potential difference is generated between the first electrode 302 and the second electrode 305 that sandwich the piezoelectric layer 15 therebetween. The higher piezoelectric performance of the piezoelectric layer 15 generates a larger potential difference between the first and second electrodes. Particularly in the case where the resonance frequency of the vibration part 300b is close to the frequency of mechanical vibration to be applied externally to the element, the amplitude of the vibration part 300b increases and thus the electric power generation characteristics are improved. Therefore, the weight load 306 is preferably used to adjust the resonance frequency of the vibration part 300b to be close to the frequency of mechanical vibration applied externally to the element.

EXAMPLES

Hereinafter, the present invention is described in more detail with reference to examples. The present invention is not limited to the following examples.

Example 1

In the example 1, a piezoelectric film having a structure shown in FIG. 1C was fabricated. The piezoelectric film comprises the substrate 11, the Pt electrode layer 13, the $(Na_xBi_y)TiO_{0.5x+1.5y+2}$—$BaTiO_3$ layer 15 (x=0.37 and y=0.58), and the conductive layer 17 in this order. The fabrication procedure is as follows.

A Pt layer (with a thickness of 250 nm) having a (110) orientation was formed by RF magnetron sputtering on the surface, having a plane orientation of (110), of an MgO monocrystalline substrate. The Pt layer corresponds to the Pt electrode layer 13. The Pt layer was formed using a metallic Pt target in an argon (Ar) gas atmosphere under the film formation conditions of an RF power of 15 W and a substrate temperature of 300 degrees Celsius.

Next, a $(Na_xBi_y)TiO_{0.5x+1.5y+2}$—$BaTiO_3$ layer 15 (x=0.37 and y=0.58) (with a thickness of 2.7 μm) with a composition around the Morphotropic Phase Boundary was formed by RF magnetron sputtering on the surface of the Pt electrode layer 13. This layer is a piezoelectric layer. This layer 15 was formed using a target having the above-mentioned composition in a mixed gas atmosphere of Ar and oxygen (with a flow ratio between Ar and $O_2$ of 50:50) under the film formation conditions of an RF power of 170 W and a substrate temperature of 650 degrees Celsius.

The composition of the formed $(Na_xBi_y)TiO_{0.5x+1.5y+2}$—$BaTiO_3$ layer 15 (x=0.37 and y=0.58) was analyzed by energy dispersive X-ray spectrometry (SEM-EDX). In the measurement with use of the SEM-EDX, it was difficult to quantify a light element such as oxygen accurately, since the analysis accuracy of the light element was low. However, it was confirmed that the composition of Na, Bi, Ba, and Ti contained in the formed $(Na_xBi_y)TiO_{0.5x+1.5y+2}$—$BaTiO_3$ layer 15 (x=0.37 and y=0.58) was identical to the composition of the target.

The formed $(Na_xBi_y)TiO_{0.5x+1.5y+2}$—$BaTiO_3$ layer 15 (x=0.37 and y=0.58) was subjected to an X-ray diffraction analysis to analyze the crystal structure thereof. The X-ray diffraction analysis was carried out in such a manner that an X-ray beam was made incident from over the $(Na_xBi_y)TiO_{0.5x+1.5y+2}$—$BaTiO_3$ layer 15.

Figure 9:
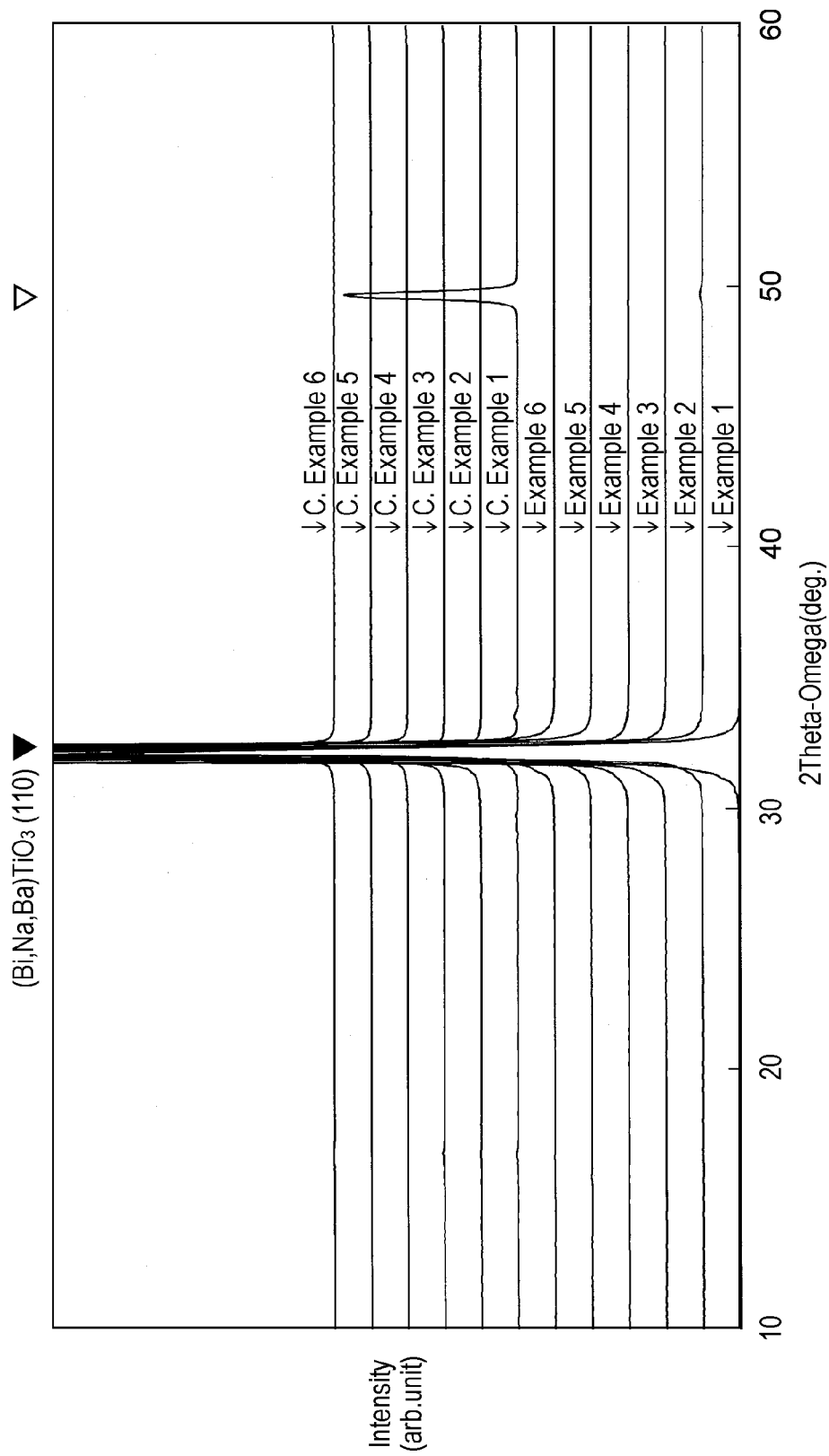
FIG. 9 is a diagram showing X-ray diffraction profiles of the piezoelectric films according to the examples 1-6 and the comparative examples 1-6.

FIG. 9 shows the result. In the following examples and comparative examples, the identical X-ray diffraction analysis was used.

FIG. 9 shows the results of the X-ray diffraction profile. Observed was only the reflection peak derived from the (110)-oriented $(Na_xBi_y)TiO_{0.5x+1.5y+2}$—$BaTiO_3$ layer 15, except for the reflection peaks derived from the MgO substrate and the Pt layer. The intensity of the (110) reflection peak was 1,089,242 cps, which was a very high level. The profile shown in FIG. 9 means that the obtained $(Na_xBi_y)TiO_{0.5x+1.5y+2}$—$BaTiO_3$ layer 15 has significantly high (110) orientation.

Subsequently, the half value width of the (110) reflection peak derived from the $(Na_xBi_y)TiO_{0.5x+1.5y+2}$—$BaTiO_3$ layer 15 in the profile was obtained by rocking curve measurement. The rocking curve measurement is a measurement in which the incident angle of the X-ray beam to the sample is scanned while the diffraction angle 2θ is fixed to the diffraction angle of the reflection peak to be measured. The smaller the half value width is, the higher the crystallinity is. As a result, the obtained half value width was a very small value of 0.23°. This means that the $(Na_xBi_y)TiO_{0.5x+1.5y+2}$—$BaTiO_3$ layer 15 fabricated in the example 1 has extremely high crystallinity. In the following examples and the comparative examples below, the same method was used to measure the half value widths of the reflection peaks.

Next, an Au layer with a thickness of 100 nm was formed by vapor deposition on the surface of the $(Na_xBi_y)TiO_{0.5x+1.5y+2}$—$BaTiO_3$ layer 15. This Au layer corresponds to the conductive layer 17. Thus, the piezoelectric film according to the example was prepared.

Figure 10:
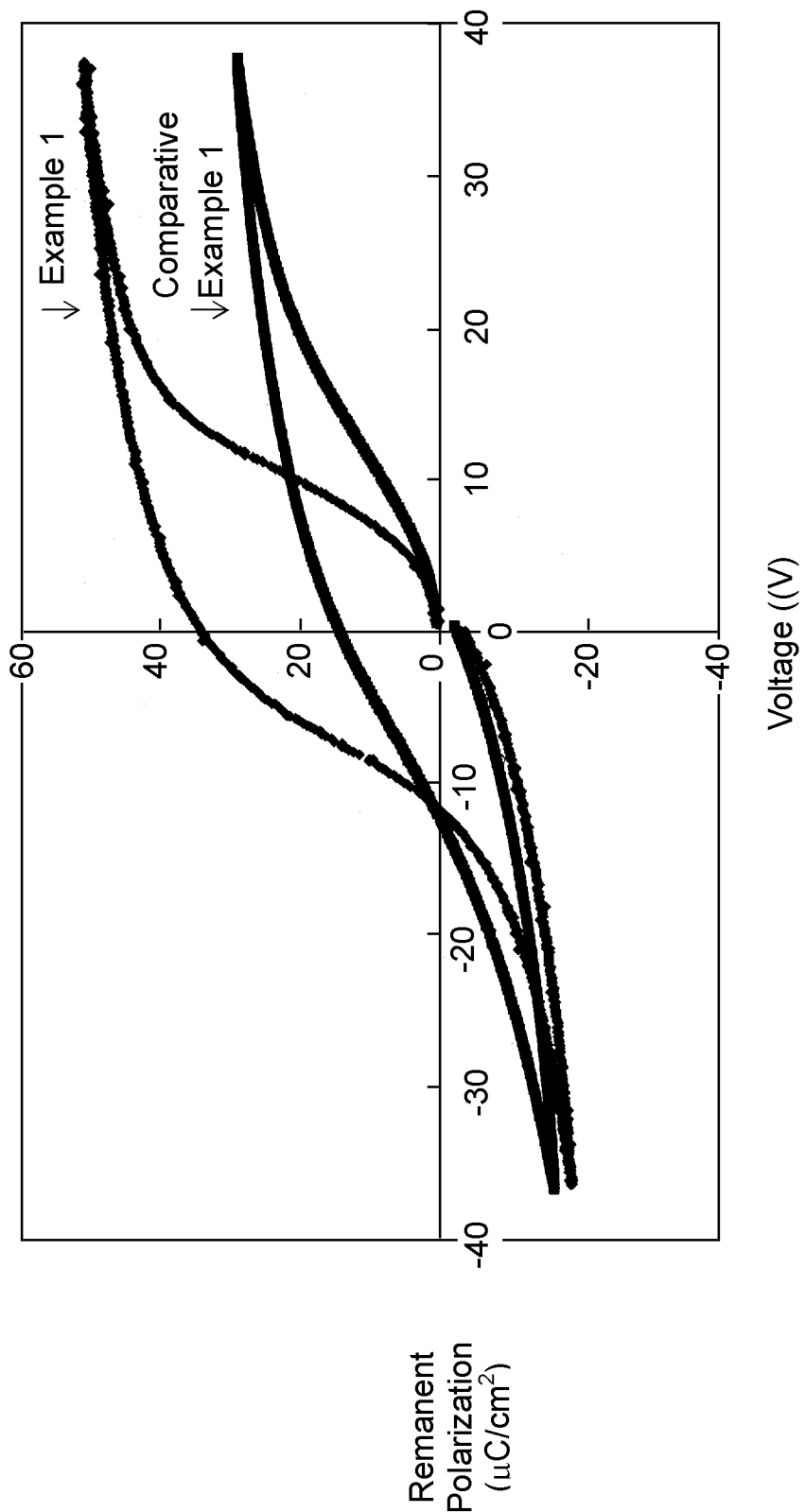
FIG. 10 is a diagram showing P-E hysteresis loops of the piezoelectric films according to the example 1 and the comparative example 1.

The ferroelectric property and piezoelectric performance of the piezoelectric film were evaluated. FIG. 10 shows a P-E hysteresis loop of the piezoelectric film according to the example 1.

As shown in FIG. 10, it was confirmed that the piezoelectric film exhibited better ferroelectric properties with an increase in the voltage applied to the piezoelectric layer through the Pt layer and the Au layer. An impedance analyzer was used to measure the dielectric loss (tan δ) at 1 kHz. As a result, the value of tan δ of the piezoelectric film was 4.6%. This means that the leak current of the piezoelectric film is small.

The piezoelectric performance of the piezoelectric film was evaluated in the following manner. The piezoelectric film was cut into a strip with a width of 2 mm and worked into a cantilever shape. A potential difference was applied between the Pt layer and the Au layer, and the resulting displacement of the cantilever was measured with a laser displacement meter. The measured displacement was converted into a piezoelectric constant d31 to evaluate the piezoelectric performance. The piezoelectric constant d31 of the piezoelectric film according to the example 1 was −163 pC/N.

Example 2

An identical experiment to that of the example 1 was performed except for x=0.30 and y=0.56.
The intensity of the (110) reflection peak according to the example 2 was very strong value of 447, 747 cps.

Example 3

An identical experiment to that of the example 1 was performed except for x=0.46 and y=0.55.
The intensity of the (110) reflection peak according to the example 3 was very strong value of 520,506 cps.

Example 4

An identical experiment to that of the example 1 was performed except for x=0.38 and y=0.51.
The intensity of the (110) reflection peak according to the example 4 was very strong value of 338,115 cps.

Example 5

An identical experiment to that of the example 1 was performed except for x=0.39 and y=0.62.
The intensity of the (110) reflection peak according to the example 5 was very strong value of 473,671 cps.

Example 6

An identical experiment to that of the example 1 was performed except that manganese with a concentration of 0.2 mol % was added as an additive to the $(Na_xBi_y)TiO_{0.5x+1.5y+2}$—$BaTiO_3$ layer (x=0.36 and y=0.58).
The intensity of the (110) reflection peak according to the example 6 was very strong value of 587,665 cps. The piezoelectric constant d31 of the piezoelectric film according to the example 6 was −221 pC/N.

Comparative Example 1

An identical experiment to that of the example 1 was performed except for x=0.5 and y=0.5.
In the comparative example 1, the reflection peak derived from the (110)-oriented $(Na_xBi_y)TiO_{0.5x+1.5y+2}$—$BaTiO_3$ layer 15 was observed. However, another reflection peak derived in the $(Na_xBi_y)TiO_{0.5x+1.5y+2}$—$BaTiO_3$ layer 15 was also observed. The intensity of the above (110) reflection peak was 71,534 cps, which was much lower than the peak intensity (1,089,242 cps) in the example 1. This means that the $(Na_xBi_y)TiO_{0.5x+1.5y+2}$—$BaTiO_3$ layer 15 in the comparative example 1 has a lower degree of orientation than the $(Na_xBi_y)TiO_{0.5x+1.5y+2}$—$BaTiO_3$ layer 15 in the examples.

The half value width of the above (110) reflection peak was 0.62°, which was greater than the widths in the examples. This means that the $(Na_xBi_y)TiO_{0.5x+1.5y+2}$—$BaTiO_3$ layer in the comparative example 1 has a lower degree of orientation than the $(Na_xBi_y)TiO_{0.5x+1.5y+2}$—$BaTiO_3$ layer in the examples.

Next, an Au layer with a thickness of 100 nm was formed by vapor deposition on the surface of the $(Na_xBi_y)TiO_{0.5x+1.5y+2}$—$BaTiO_3$ layer so as to obtain a piezoelectric film according to the comparative example 1.

The ferroelectric properties and piezoelectric performance of this piezoelectric film were evaluated with use of the Pt layer and the Au layer included in the piezoelectric film. However, a leak current in the piezoelectric film was very large, and the ferroelectric properties (value of the remanent polarization) by the P-E hysteresis measurement were much lower than that of the example 1 (see FIG. 10). The value of tan 6 of the piezoelectric film was 9.8%. Since the piezoelectric film according to the comparative example 1 has such a large leak current, the piezoelectric constant d31 was −68 pC/N.

Comparative Example 2

An identical experiment to that of the example 1 was performed except for x=0.28 and y=0.58.
The intensity of the (110) reflection peak according to the comparative example 2 was very weak value of 60,219 cps.

Comparative Example 3

An identical experiment to that of the example 1 was performed except for x=0.48 and y=0.59.
The intensity of the (110) reflection peak according to the comparative example 3 was very weak value of 32,973 cps.

Comparative Example 4

An identical experiment to that of the example 1 was performed except for x=0.36 and y=0.50.
The intensity of the (110) reflection peak according to the comparative example 4 was very weak value of 69,290 cps.

Comparative Example 5

An identical experiment to that of the example 1 was performed except for x=0.40 and y=0.65.
The intensity of the (110) reflection peak according to the comparative example 5 was very weak value of 50,052 cps.

Comparative example 6

An identical experiment to that of the example 1 was performed except for x=0.29 and y=0.43.
The intensity of the (110) reflection peak according to the comparative example 6 was very weak value of 32,084 cps.

The following Table 1 summarizes the results of the examples 1-6 and the comparative examples 1-6.

TABLE 1

| | base substrate | Electrode | piezoelectric layer Na(x) | Bi(y) | additive | crystal orientation of the piezoelectric layer orientation direction | (110) peak intensity | Effect |
|---|---|---|---|---|---|---|---|---|
| Comparative Example 1 | MgO(110) | Pt(110) | 0.5 | 0.5 | — | plural peeks including (110) | 71,534 cps | Poor |
| Comparative Example 2 | MgO(110) | Pt(110) | 0.28 | 0.58 | — | (110) | 60,219 cps | Poor |
| Example 2 | MgO(110) | Pt(110) | 0.30 | 0.56 | — | (110) | 447,747 cps | Good |
| Example 1 | MgO(110) | Pt(110) | 0.37 | 0.58 | — | (110) | 1,089,242 cps | Excellent |
| Example 3 | MgO(110) | Pt(110) | 0.46 | 0.55 | — | (110) | 520,506 cps | Good |
| Comparative Example 3 | MgO(110) | Pt(110) | 0.48 | 0.59 | — | (110) | 32,973 cps | Poor |
| Comparative Example 4 | MgO(110) | Pt(110) | 0.36 | 0.50 | — | (110) | 69,290 cps | Poor |
| Example 4 | MgO(110) | Pt(110) | 0.38 | 0.51 | — | (110) | 338,115 cps | Good |
| Example 1 | MgO(110) | Pt(110) | 0.37 | 0.58 | — | (110) | 1,089,242 cps | Excellent |
| Example 5 | MgO(110) | Pt(110) | 0.39 | 0.62 | — | (110) | 473,671 cps | Good |
| Comparative Example 5 | MgO(110) | Pt(110) | 0.40 | 0.65 | — | (110) | 50,052 cps | Poor |
| Comparative Example 6 | MgO(110) | Pt(110) | 0.29 | 0.43 | — | (110) | 32,084 cps | Poor |
| Example 6 | MgO(110) | Pt(110) | 0.36 | 0.58 | Mn | (110) | 587,665 cps | Good |

As shown in Table 1, the $(Na_xBi_y)TiO_{0.5x+1.5y+2}$—$BaTiO_3$ layer ($0.30 \leq x \leq 0.46$ and $0.51 \leq y \leq 0.62$) 15 with a (110) orientation has high (110) orientation and high crystallinity.

In other words, the examples 1-6 to the comparative examples 1-6 reveals that the $(Na_xBi_y)TiO_{0.5x+1.5y+2}$—$BaTiO_3$ layer ($0.30 \leq x \leq 0.46$ and $0.51 \leq y \leq 0.62$) 15 has high (110) orientation and high crystallinity.

The example 3 and the comparative example 3 mean that x must not be over 0.46.

The example 2 and the comparative example 2 mean that x must not be less than 0.30.

The example 5 and the comparative example 5 mean that y must not be over 0.62.

The example 4 and the comparative example 4 mean that y must not be less than 0.51.

The example 6 means that the addition of manganese improves the piezoelectric constant of the $(Na_xBi_y)TiO_{0.5x+1.5y+2}$—$BaTiO_3$ layer.

The addition of manganese also improves the dielectric loss of the $(Na_xBi_y)TiO_{0.5x+1.5y+2}$—$BaTiO_3$ layer.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

(Non-Obviousness from Patent Literature 3 in View of Patent Literature 4)

Patent Literature 4 discloses a piezoelectric element (see the paragraph [0004]). The BNT_08 7 crystal in Table 1 of Patent Literature 4 (page 15) is made of $Na_{29.94}Bi_{45.79}Ti_{109.66}O_{308.78}Ba_{5.82}$.

Patent Literature 3 discloses piezoelectric ceramics where high (100) surface orientation is obtained stably. Particularly, Patent Literature 3 discloses $x(Bi_{0.5}Na_{0.5}TiO_3)$-$(1-x)ABO$ (x is not less than 0.1 and not more than 1) which contains an excess amount of Bi by 0.1%, which is more than the amount of Bi in the stoichiometirc proportion. An example of the ABO is $BaTiO_3$ (see the paragraph [0020]).

In order to obtain high (100) surface orientation disclosed in Patent Literature 3, the amount of Bi contained in the BNT_08 7 crystal, which is disclosed in Patent Literature 4, may be increased in such a manner that the amount of Bi is over 45.79.

Figure 11A:
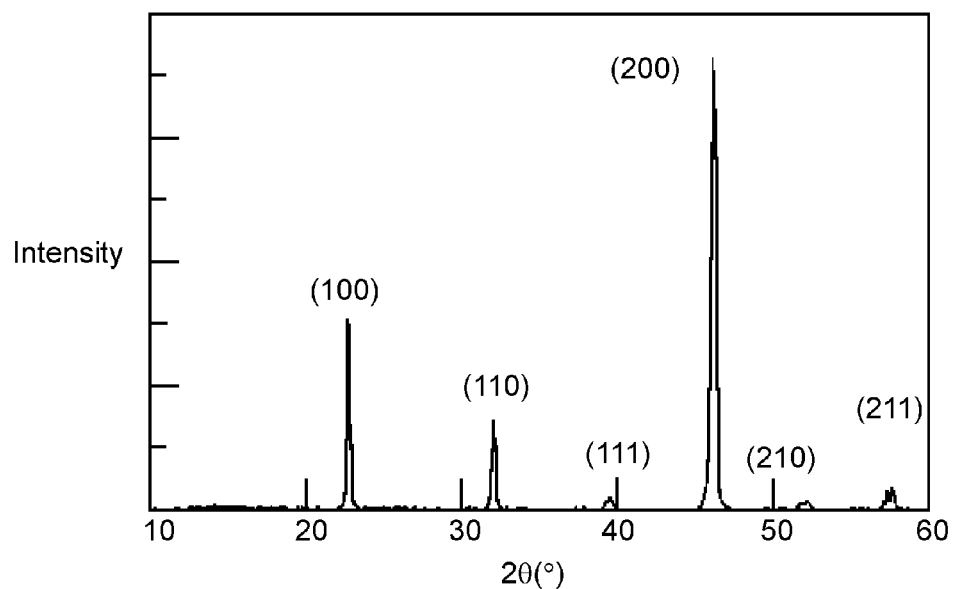
FIG. 11A shows the FIG. 2 disclosed in Patent Literature 6.
Figure 11B:
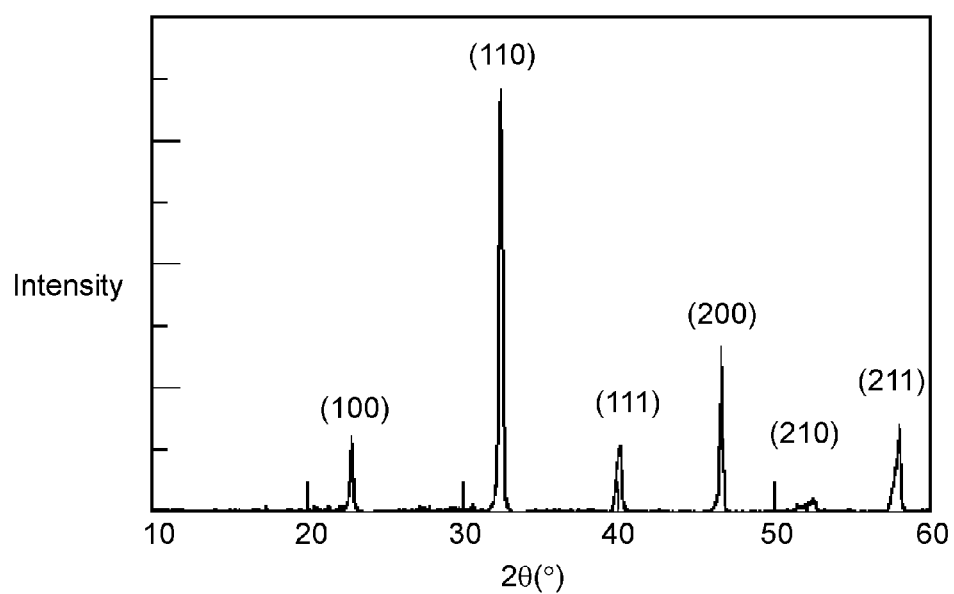
FIG. 11B shows the FIG. 2 disclosed in Patent Literature 6.

FIG. 11A shows an X-ray diffraction pattern of a BNT crystal which does not contain excess Bi (see the FIG. 2 in Patent Literature 3). FIG. 11B shows an X-ray diffraction pattern of a BNT crystal containing excess Bi by 2% (see the FIG. 2 in Patent Literature 3).

As is clear from FIG. 11A and FIG. 11B, the excess Bi lowers the (110) peak and the (111) peak. This means that the excess Bi disturbs the (110) orientation and the (111) orientation.

Accordingly, in order to increase the degree of the (110) orientation, Bi would not be added to the BNT crystal.

Specifically, since the FIG. 2 (FIG. 11A and FIG. 11B of the present application) in Patent Literature 3 discloses that the excess Bi disturbs the (110) orientation and the (111) orientation, Bi is never be added to the BNT crystal in order to enhance the degree of the (110) orientation of the BNT crystal disclosed in Patent Literature 4.

INDUSTRIAL APPLICABILITY

The piezoelectric film has a high ferroelectric property (for example, small dielectric loss) and a high piezoelectric performance, since the $(Na_xBi_y)TiO_{0.5x+1.5y+2}$—$BaTiO_3$ layer ($0.30 \leq x \leq 0.46$ and $0.51 \leq y \leq 0.62$) has high crystallinity, high (110) orientation, and small leak current. The piezoelectric film according to the present invention is useful as a piezoelectric film alternative to existing lead-containing oxide ferroelectrics. The piezoelectric film of the present invention can be used suitably for applications such as pyroelectric sensors and piezoelectric devices in which piezoelectric films are used. Examples of such applications are the ink jet head, angular velocity sensor and piezoelectric generating element of the present invention.

The ink jet head of the present invention has excellent ink ejection characteristics although it does not contain a lead-containing ferroelectric material such as PZT. The method of forming an image by this ink jet head has high image forming accuracy and high expressivity. The angular velocity sensor of the present invention has high sensitivity although it does not contain a lead-containing ferroelectric material such as PZT. The method of measuring an angular velocity by this angular velocity sensor has excellent measurement sensitivity. The piezoelectric generating element of the present invention has excellent electric power generation characteristics although it does not contain a lead-containing ferroelectric material such as PZT. The electric power generation method of the present invention using this piezoelectric generating element has high electric power generation efficiency. The ink jet head, angular velocity sensor and piezoelectric generating element, and the image forming method, angular velocity measurement method and electric power generation method according to the present invention can be widely applied to various fields and uses.

| REFERENCE MARKS IN THE DRAWINGS | |
|---|---|
| 11 | substrate |
| 13 | electrode layer |
| 15 | $(Na_xBi_y)TiO_{0.5x+1.5y+2}$•$BaTiO_3$ layer |
| 17 | conductive layer |
| 16a, 16c | multilayer structure |
| 101 | through-holes |
| 102 | pressure chambers |
| 102a | walls |
| 102b | walls |
| 103 | individual electrode layer |
| 104 | piezoelectric film |
| 105 | common liquid chambers |
| 106 | supply port |
| 107 | ink passage |
| 108 | nozzle hole |
| 111 | vibration layer |
| 112 | common electrode layer |
| 113 | intermediate layer |
| 114 | adhesive layer |
| 120 | base substrate |
| 130 | substrate |
| 200 | substrate |
| 200a | stationary part |
| 200b | vibration part |
| 202 | first electrode |
| 205 | second electrode |
| 206 | drive electrode |
| 206a | connection terminal |
| 207 | sense electrode |
| 207a | connection terminal |
| 208 | piezoelectric film |
| 300 | substrate |
| 300a | stationary part |
| 300b | vibration part |
| 302 | first electrode |
| 305 | second electrode |
| 306 | weight load |

The invention claimed is:

1. A piezoelectric film consisting of a $(Na_xBi_y)TiO_{0.5x+1.5y+2}$—$BaTiO_3$ layer with a (110) orientation only, where $0.30 \leq x \leq 0.46$ and $0.51 \leq y \leq 0.62$,
wherein the $(Na_xBi_y)TiO_{0.5x+1.5y+2}$—$BaTiO_3$ layer has composition around a Morphotropic Phase Boundary.

2. The piezoelectric film according to claim 1, further comprising:
a first electrode with a (110) orientation, wherein the first electrode and the $(Na_xBi_y)TiO_{0.5x+1.5y+2}$—$BaTiO_3$ layer are laminated.

3. The piezoelectric film according to claim 2, wherein the first electrode is made of metal.

4. The piezoelectric film according to claim 3, wherein the metal is platinum, palladium, or gold.

5. The piezoelectric film according to claim 4, wherein the metal is platinum.

6. An ink jet head comprising:
a piezoelectric film having a piezoelectric layer sandwiched between a first electrode and a second electrode;
a vibration layer bonded to the piezoelectric film; and
a pressure chamber member having a pressure chamber for storing ink and bonded to a surface of the vibration layer opposite to a surface to which the piezoelectric film is bonded, wherein
the vibration layer is bonded to the piezoelectric film so that the vibration layer is displaceable in its film thickness direction according to a deformation of the piezoelectric film produced by a piezoelectric effect,
the vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber, and
the piezoelectric layer consists of a $(Na_xBi_y)TiO_{0.5x+1.5y+2}$—$BaTiO_3$ layer ($0.30 \leq x \leq 0.46$ and $0.51 \leq y \leq 0.62$) with a (110) orientation only and the $(Na_xBi_y)TiO_{0.5x+1.5y+2}$—$BaTiO_3$ layer has composition around a Morphotropic Phase Boundary.

7. The ink jet head according to claim 6, wherein the first electrode has a (110) orientation, and the first electrode and the $(Na_xBi_y)TiO_{0.5x+1.5y+2}$—$BaTiO_3$ layer are laminated.

8. The ink jet head according to claim 7, wherein the first electrode is made of metal.

9. The ink jet head according to claim 8, wherein the metal is platinum, palladium, or gold.

10. The ink jet head according to claim 9, wherein the metal is platinum.

11. A method of forming an image by an ink jet head, comprising:
preparing the ink jet head, wherein
the ink jet head includes: a piezoelectric film having a piezoelectric layer sandwiched between a first electrode and a second electrode; a vibration layer bonded to the piezoelectric film; and a pressure chamber member having a pressure chamber for storing ink and bonded to a surface of the vibration layer opposite to a surface to which the piezoelectric film is bonded,
the vibration layer is bonded to the piezoelectric film so that the vibration layer is displaceable in its film thickness direction according to a deformation of the piezoelectric film produced by a piezoelectric effect,
the vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber, and
the piezoelectric layer consists of a $(Na_xBi_y)TiO_{0.5x+1.5y+2}$—$BaTiO_3$ layer ($0.30 \leq x \leq 0.46$ and $0.51 \leq y \leq 0.62$) with a (110) orientation only and the $(Na_xBi_y)TiO_{0.5x+1.5y+2}$—$BaTiO_3$ layer has composition around a Morphotropic Phase Boundary; and
applying a voltage to the piezoelectric layer through the first electrode and the second electrode to displace, based on the piezoelectric effect, the vibration layer in its film thickness direction so that the volumetric capacity of the pressure chamber changes and the ink is ejected from the pressure chamber by the displacement.

12. The method according to claim 11, wherein the first electrode has a (110) orientation, and the first electrode and the $(Na_xBi_y)TiO_{0.5x+1.5y+2}$—$BaTiO_3$ layer are laminated.

13. The method according to claim 12, wherein the first electrode is made of metal.

14. The method according to claim 13, wherein the metal is platinum, palladium, or gold.

15. The method according to claim 14, wherein the metal is platinum.

16. An angular velocity sensor comprising:
a substrate having a vibration part; and
a piezoelectric film bonded to the vibration part and having a piezoelectric layer sandwiched between a first electrode and a second electrode, wherein
the piezoelectric layer consists of a $(Na_xBi_y)TiO_{0.5x+1.5y+2}$—$BaTiO_3$ layer ($0.30 \leq x \leq 0.46$ and $0.51 \leq y \leq 0.62$) with a (110) orientation only and the $(Na_xBi_y)TiO_{0.5x+1.5y+2}$—$BaTiO_3$ layer has composition around a Morphotropic Phase Boundary, and
one of the first electrode and the second electrode selected therefrom is composed of an electrode group including a drive electrode for applying a driving voltage that oscillates the vibration part to the piezoelectric layer and a sense electrode for measuring a deformation of the vibration part caused by an angular velocity applied to the oscillating vibration part.

17. The angular velocity sensor according to claim 16, wherein
the first electrode has a (110) orientation, and
the first electrode and the $(Na_xBi_y)TiO_{0.5x+1.5y+2}$—$BaTiO_3$ layer are laminated.

18. The angular velocity sensor according to claim 17, wherein the first electrode is made of metal.

19. The angular velocity sensor according to claim 18, wherein the metal is platinum, palladium, or gold.

20. The angular velocity sensor according to claim 19, wherein the metal is platinum.

21. A method of measuring an angular velocity by an angular velocity sensor, comprising:
preparing the angular velocity sensor, wherein:
the angular velocity sensor includes: a substrate having a vibration part; and a piezoelectric film bonded to the vibration part and having a piezoelectric layer sandwiched between a first electrode and a second electrode,
the piezoelectric layer consists of a $(Na_xBi_y)TiO_{0.5x+1.5y+2}$—$BaTiO_3$ layer ($0.30 \leq x \leq 0.46$ and $0.51 \leq y \leq 0.62$) with a (110) orientation only and the $(Na_xBi_y)TiO_{0.5x+1.5y+2}$—$BaTiO_3$ layer has composition around a Morphotropic Phase Boundary, and
one of the first electrode and the second electrode selected therefrom is composed of an electrode group including a drive electrode and a sense electrode;
applying a driving voltage to the piezoelectric layer through the drive electrode and the other of the first electrode and the second electrode selected therefrom to oscillate the vibration part; and
measuring, through the other electrode and the sense electrode, a deformation of the vibration part caused by an angular velocity applied to the oscillating vibration part to obtain a value of the applied angular velocity.

22. The method according to claim 21, wherein the first electrode has a (110) orientation, and the first electrode and the $(Na_xBi_y)TiO_{0.5x+1.5y+2}$—$BaTiO_3$ layer are laminated.

23. The method according to claim 22, wherein the first electrode is made of metal.

24. The method according to claim 23, wherein the metal is platinum, palladium, or gold.

25. The method according to claim 24, wherein the metal is platinum.

26. A piezoelectric generating element comprising:
a substrate having a vibration part; and
a piezoelectric film bonded to the vibration part and having a piezoelectric layer sandwiched between a first electrode and a second electrode, wherein
the piezoelectric layer consists of a $(Na_xBi_y)TiO_{0.5x+1.5y+2}$—$BaTiO_3$ layer ($0.30 \leq x \leq 0.46$ and $0.51 \leq y \leq 0.62$) with a (110) orientation only and the $(Na_xBi_y)TiO_{0.5x+1.5y+2}$—$BaTiO_3$ layer has composition around a Morphotropic Phase Boundary.

27. The piezoelectric generating element according to claim 26, wherein
the first electrode has a (110) orientation, wherein
the first electrode and the $(Na_xBi_y)TiO_{0.5x+1.5y+2}$—$BaTiO_3$ layer are laminated.

28. The piezoelectric generating element according to claim 27, wherein
the first electrode is made of metal.

29. The piezoelectric generating element according to claim 28, wherein
the metal is platinum, palladium, or gold.

30. The piezoelectric generating element according to claim 29, wherein
the metal is platinum.

31. A method of generating electric power using a piezoelectric generating element, comprising:
preparing the piezoelectric generating element, wherein
the piezoelectric generating element includes: a substrate having a vibration part; and a piezoelectric film bonded to the vibration part and having a piezoelectric layer sandwiched between a first electrode and a second electrode, and
the piezoelectric layer consists of a $(Na_xBi_y)TiO_{0.5x+1.5y+2}$—$BaTiO_3$ layer ($0.30 \leq x \leq 0.46$ and $0.51 \leq y \leq 0.62$) with a (110) orientation only and the $(Na_xBi_y)TiO_{0.5x+1.5y+2}$—$BaTiO_3$ layer has composition around a Morphotropic Phase Boundary; and
vibrating the vibration part to obtain electric power through the first electrode and the second electrode.

32. The method according to claim 31, wherein
the first electrode has a (110) orientation, wherein
the first electrode and the $(Na_xBi_y)TiO_{0.5x+1.5y+2}$—$BaTiO_3$ layer are laminated.

33. The method according to claim 32, wherein the first electrode is made of metal.

34. The method according to claim 33, wherein the metal is platinum, palladium, or gold.

35. The method according to claim 34, wherein the metal is platinum.

\* \* \* \* \*